US008427167B2

(12) United States Patent
Streit

(10) Patent No.: US 8,427,167 B2
(45) Date of Patent: Apr. 23, 2013

(54) ARCHITECTURE AND METHOD TO DETERMINE LEAKAGE IMPEDANCE AND LEAKAGE VOLTAGE NODE

(75) Inventor: Lawrence C. Streit, Noblesville, IN (US)

(73) Assignee: Analog Devices, Inc., Norwood, MA (US)

( * ) Notice: Subject to any disclaimer, the term of this patent is extended or adjusted under 35 U.S.C. 154(b) by 437 days.

(21) Appl. No.: 12/748,117

(22) Filed: Mar. 26, 2010

(65) Prior Publication Data

US 2010/0259276 A1 Oct. 14, 2010

Related U.S. Application Data

(60) Provisional application No. 61/167,724, filed on Apr. 8, 2009.

(51) Int. Cl.
 *G01N 27/416* (2006.01)
 *G01R 31/08* (2006.01)
 *G01R 31/02* (2006.01)
 *H02H 9/08* (2006.01)

(52) U.S. Cl.
 USPC ............ 324/433; 324/525; 324/541; 361/42

(58) Field of Classification Search ............ 324/433, 324/503, 509, 522, 541, 544; 361/30, 33, 361/42, 47, 49, 50, 86; 340/636.1, 636.15, 340/636.19, 650, 651; 307/10.7
See application file for complete search history.

(56) References Cited

U.S. PATENT DOCUMENTS

| | | | | |
|---|---|---|---|---|
| 4,472,676 A * | 9/1984 | Eichmann et al. | ............ | 324/509 |
| 6,952,103 B2 * | 10/2005 | Herb et al. | ............ | 324/500 |
| 7,994,799 B2 * | 8/2011 | Tachizaki | ............ | 324/551 |
| 8,040,139 B2 * | 10/2011 | Plagens et al. | ............ | 324/509 |
| 2007/0285057 A1 * | 12/2007 | Yano | ............ | 320/116 |

OTHER PUBLICATIONS

SAE International, Surface Vehicle Recommended Practice, J1766, Revised Apr. 2005.
UN Economic and Social Council, ECE/TRANS/WP.29/2010/52, pp. 1-45.

* cited by examiner

*Primary Examiner* — Richard V Muralidar
(74) *Attorney, Agent, or Firm* — Kenyon & Kenyon LLP

(57) ABSTRACT

A circuit, system and method for detecting the presence of a leakage path in a multi-cell voltage source is described. The system includes a detection circuit, the detection circuit having a first amplifier and a second amplifier, a first input of the first amplifier connected to a first terminal of the voltage source and the first input of the second amplifier connected to a second terminal of the voltage source, a second input of each of the first and second amplifiers connected to a reference voltage point, and an output of each of the first and second amplifiers connected to a respective first and second output of the detection circuit; and a processor having inputs connected to the first and second outputs of the detection circuit.

16 Claims, 3 Drawing Sheets

_US 8,427,167 B2_

ARCHITECTURE AND METHOD TO DETERMINE LEAKAGE IMPEDANCE AND LEAKAGE VOLTAGE NODE

This application claims the benefit of U.S. Provisional Patent Application Ser. No. 61/167,724 filed on Apr. 8, 2009, the entire contents of which are incorporated herein by reference.

BACKGROUND

The present invention is directed to a circuit and method for detecting the presence of a leakage impedance and determining its location within a high voltage stack of direct current voltage sources (e.g., a battery). A leakage impedance is an error condition where a battery in a battery stack, such as in a hybrid vehicle, is experiencing a fault condition, for example, caused by faulty circuit components and/or faulty insulation or the like. The leakage impedance indicates that a circuit path from the floating battery to chassis of the vehicle is formed. This can be a potentially life-threatening hazard. Previous attempts to make determinations of leakage impedance and location of leakage voltage nodes were costly and/or had measurement errors that were unacceptable. Accordingly, there is a need for a low cost and more precise alternative to the prior art systems.

DETAILED DESCRIPTION

Embodiments of the present invention provide a method for identifying a presence of a leakage path in a multi-cell voltage source. A measurement of the voltage of the voltage source may be obtained using a first circuit path configuration to obtain a first voltage measurement. The first circuit path configuration comprising a pair of amplifiers in inverting configurations. When the first voltage measurement shows a deviation from a predetermined voltage, the first circuit path configuration may be configured to a second circuit path configuration. A measurement of the voltage of the voltage source may be obtained using the second circuit path configuration to obtain a second voltage measurement. A leakage impedance and a leakage voltage may be derived from the first and second measurements.

Embodiments of the present invention provide a system for determining a leakage impedance and measuring voltage of a voltage source. The system may include a voltage source, a detection circuit, an analog-to-digital converter, and a processor. The voltage source may be formed from multiple voltage cells. The detection circuit may have a first circuit path configuration to obtain a first measurement of the voltage source and a second circuit path configuration to obtain a second measurement of the voltage source. The second circuit path configuration may be implemented when the first voltage measurement shows a deviation from a predetermined voltage. The processor may identify a leakage impedance of the voltage source using the first measured voltage and the second measured voltage.

Embodiments of the present invention provide a circuit for detecting a leakage impedance and leakage voltage of a voltage source having a plurality of voltage sources. The circuit includes two inputs, a pair of amplifiers, input resistors, feedback resistors and two outputs. A first input of the two inputs may be connected to a positive terminal of the voltage source and a second input of the two inputs may be connected to a negative terminal of the voltage source. The non-inverting input of each of the pair of amplifiers may be connected to a reference voltage source. The output of each of the amplifiers may be connected to a respective one of the two outputs of the circuit. A first input resistor may be connected to a first input of the circuit and to an inverting input of a first amplifier of the pair of amplifiers. At the input of the circuit may be a pair of input resistors, each of which is respectively connected between the negative and positive terminals of the voltage source and the inverting inputs of each of the pair of amplifiers. The feedback resistors may each be respectively connected between an output and an inverting input of a respective one of the pair of amplifiers.

Figure 1:
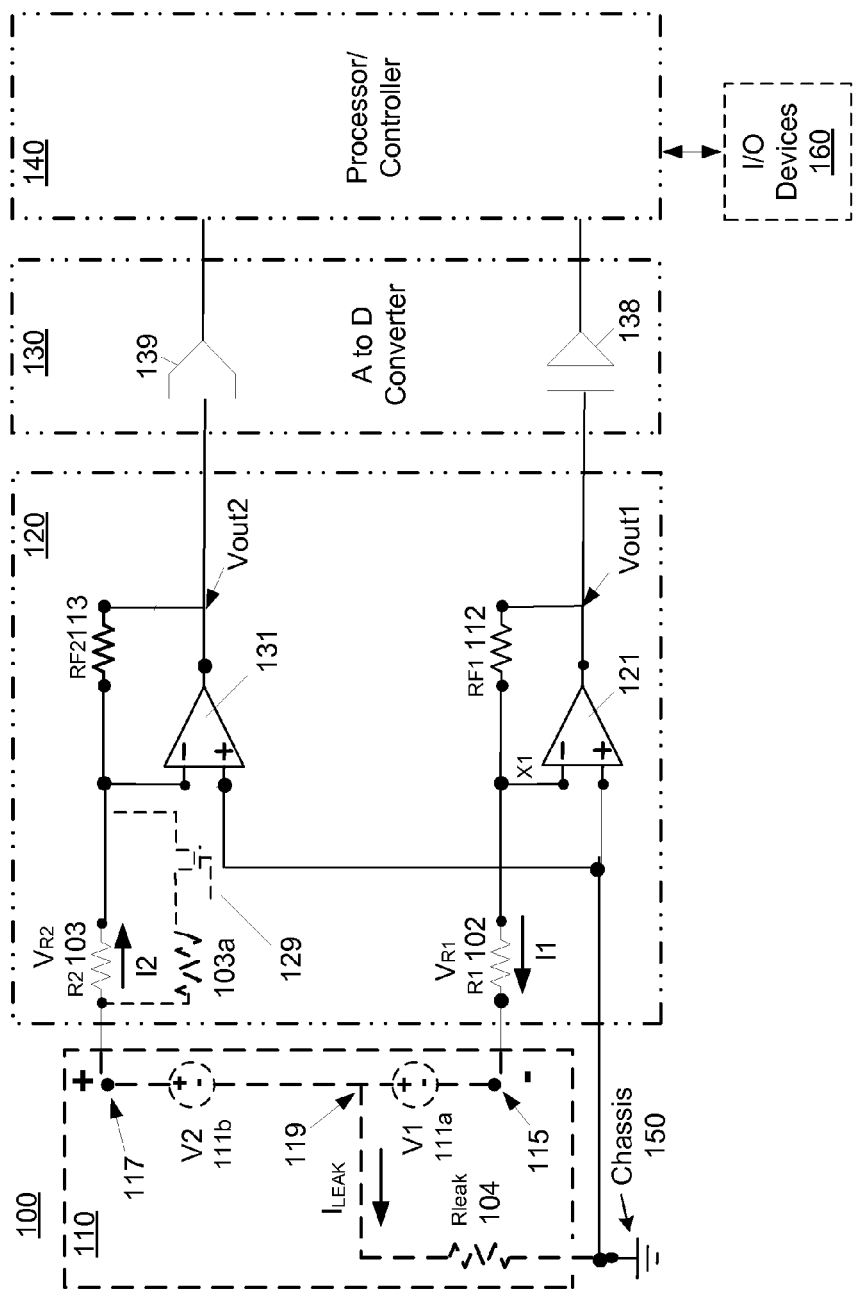
FIG. 1 illustrates an exemplary circuit according to an embodiment of the present invention.

The system 100 illustrated in FIG. 1 can include a battery stack 110, a detection circuit 120, an analog-to-digital converter 130, and a processor/controller 140 according to an embodiment of the present invention. The battery stack 110 may be a battery stack used in an hybrid electric vehicle, for example. The processor/controller 140 may be an existing component on a vehicle, and the analog-to-digital converter 130 may be on the processor/controller 140 or on a separate device. The processor/controller 140 may further process the outputs from the analog-to-digital converter 130. The detection circuit 120 may be implemented as a stand-alone circuit component, or incorporated in an application specific standard product (ASSP) with the analog-to-digital converter 130, and with/or without the processor/controller 140.

The battery stack 110, shown in phantom, may comprise a plurality of battery cells. The battery stack 110 may not be connected electrically to the chassis, such as in a hybrid vehicle. The battery stack 110 may be called a "floating" voltage source when not connecting it to the chassis as previously explained in the background. For ease of explanation, the battery stack 110 is modeled as a pair of voltage sources 111a and 111b. The battery stack 110 can be located in a vehicle or on a structure. The battery stack 110 has a total battery voltage that is equal to the sum of voltages V1+V2 provided by voltage sources 111a and 111b, with the positive (+) terminal connected to node 117 and the negative terminal (−) connected to node 115.

A leakage impedance may be an error condition where a battery cells in the battery stack 110 is experiencing a fault condition, such as faulty circuit components or faulty wiring insulation or the like, and a circuit path having a leakage impedance, represented by Rleak 104, from the battery 110 to chassis 150 may be formed. Leakage impedance Rleak 104 is shown connected between voltage sources 111a and 111b of the battery stack 110 to chassis 150. Leakage currents may occur anywhere in the battery stack 110, and therefore, the relative magnitudes of the voltages V1, V2 are considered unknown quantities in the following description.

The analog-to-digital converter (ADC) 130 may have inputs for reading the voltages Vout1 and Vout2 output from the detection circuit 120. Two ADC inputs may be connected to individual analog-to-digital (A/D) converters 138 and 139, which output respective digital values representative of the voltages Vout1 and Vout2. Of course, the A/D converters 138 and 139 may be optional, integrated into processor/controller 140 or configured in a different manner to provide an alternative arrangement per another embodiment.

Processor/controller 140 may calculate a value of battery stack 110, a value of leakage impedance Rleak 104 and a leakage voltage value at, for example, node 119. This processor may be a processor that is already available, and that performs other system processing, or processor/controller 140 may forward the digital signals to another processor for processing. Note: all voltages referred to in this disclosure are relative to the chassis 150. Optionally, the processor/controller 140 may connect to input/output devices 160 to present battery stack 110 status, alarm conditions or other information, in an audible, tactile and/or a visual presentation, to a user.

The detection circuit 120 may include a pair of inputs, a pair of outputs, a pair of amplifiers 121, 131, a pair of input resistors 102, 103, and a pair of feedback resistors 112, 113. The pair of amplifiers 121, 131, may each have a non-inverting input terminal coupled to chassis ground and an inverting input coupled to an output of the detection circuit 120 via a feedback resistor 112, 113.

The detection circuit 120 may connect to the positive (+) terminal of battery stack 110 at node 117 and to the negative (−) terminal of the battery stack 110 at node 115. A first terminal of input resistor 102 may connect to the negative (−) terminal 115 of the battery stack 110 and a second terminal of input resistor 102 may connect to an inverting input of the amplifier 121. An exemplary range of values for input resistor 102 may be 5-20 megaohms, this resistance value for input resistor 102 is represented by R1. Input resistor 103 may be coupled to the positive terminal of the battery stack 110 at node 117 and also to the inverting input terminal of the second amplifier 131. Input resistor 103 may also have an exemplary range of values between 5-20 megaohms, this resistance value for input resistor 103 is represented by R2.

Feedback resistor 112 may have a first terminal connected to the inverting input of the amplifier 121 and a second terminal connected to the output of amplifier 121. The amplifier 121 may have its inverting input connected to resistor 102 and feedback resistor 112, its non-inverting input connected to chassis ground 150, and the output of the amplifier may be connected to the second terminal of feedback resistor 112. The voltage Vout1 may be a voltage measured from the output of amplifier 121.

Similarly, a first terminal of input resistor 103 may be connected to the positive (+) terminal of the battery 110 at node 117, to a second terminal of feedback resistor 113, and to an inverting input of the amplifier 131. An exemplary range of values for input resistor 103 can be approximately 5-20 megaohms. This resistance value is represented by R2. Feedback resistor 113 may also connect to the inverting input of the amplifier 131. Feedback resistors 112 and 113 can be matched with an equal value, and have exemplary values that can range from the 10s to the 100s of Kilohms.

The amplifier 131 can have its inverting input connected to resistors 103 and 113, its non-inverting input can be connected to chassis ground, and the output of the amplifier can be connected to a second terminal of feedback resistor 113. The voltage Vout2 is a voltage measured from the output of amplifier 131. The non-inverting inputs of both amplifiers 121 and 131 may be connected to chassis ground 150.

The detection circuit 120 may be used to measure a voltage of a battery, and indicate the presence of leakage impedance from the battery to chassis. A leakage impedance path is illustrated as occurring at node 119 in the battery stack 110 to chassis ground, the leakage impedance path has a resistance Rleak 104. Node 119 models the location of leakage voltage. Node 119 can occur anywhere within the battery stack 110 and is shown at an arbitrary location. Leakage impedance Rleak 104 and leakage voltage at node 119 can have various values that may or may not change over time.

With reference to FIG. 1, in the absence of leakage resistance Rleak 104, the currents I1 and I2 may be substantially equal. Since input resistors 102 and 103 are substantially matched, the voltage VR1 (where VR1=I1*R1) drop across input resistor 102 is equal to the voltage VR2 (where VR2=I2*R2) drop across input resistor 103. This leaves an equal voltage potential, but of opposite polarity, on the respective nodes 115 and 117 relative to chassis 150. The sum of the voltages V1+V2+VR1+VR2≅0, when there is no leakage path or leakage resistance, Rleak 104.

Amplifier 121 outputs a voltage Vout1, which may have a positive potential proportional to the difference between a common mode voltage (approximately 0 volts, or chassis ground) and the voltage potential at (negative terminal) node 115. Effectively, the voltage Vout1 may be equal I1*RF1, where RF1 is the resistance value of feedback resistor 112.

Amplifier 131 outputs Vout2, which has a negative potential and is proportional to the difference between common mode (0 volts, or chassis ground) and the voltage potential at (positive terminal) node 117. Effectively, the voltage Vout2 may be equal to (−)[I2* RF2] relative to chassis 150, where RF2 is the resistance value of feedback resistor 113.

In an embodiment in which input resistors 102 and 103 have substantially the same resistance value, and feedback resistors 112 and 113 have substantially the same resistance value, when no leakage resistance, such as Rleak 104, is present, the voltages Vout1 and Vout2 can be substantially equal, but of opposite polarity, and offset equally from the chassis ground. The difference of output voltage values Vout1 and Vout2=(I1*RF1−(−)[I2*RF2]), and may be proportional to the sum of voltage V1 voltage V2 of voltage sources 111a and 111b, respectively. The detection circuit 120 can detect a leakage current, such as $I_{LEAK}$ as well.

The detection of a leakage impedance, such as Rleak 104, in battery stack 110 may be determined by identifying the presence of leakage current. Reviewing FIG. 1 under the assumption that leakage current $I_{LEAK}$ passes through leakage impedance Rleak 104, the output voltages Vout1 and Vout2 can be used to identify the presence of the leakage impedance Rleak 104. When leakage current $I_{LEAK}$ through leakage impedance Rleak 104 is present, the current I2=I1−$I_{LEAK}$, where $I_{LEAK}$ is the leakage current.

In this example, the amplifier 121 outputs voltage Vout1 that may be equal to I1*RF1. Conversely, the amplifier 131 outputs voltage Vout2 that may be equal to (−) (I2*RF2), or (−)(I1−$I_{LEAK}$)*RF2.

By determining the average of Vout1 and Vout2, it can be determined whether there is a leakage impedance, such as Rleak 104, to chassis ground. Under normal conditions (i.e., no leakage impedance), the average of voltages Vout1 and Vout2, in FIG. 1, may be equal to the voltage potential of chassis 150.

Depending upon whether the average voltage of Vout1 and Vout2 is above the average voltage potential of chassis 150, i.e., more positive (+), or below the average, i.e., more negative (−), it can be determined on which half (closer to the positive (+) terminal 117 of battery stack 110 or closer to the negative (−) terminal 115 of battery stack 110, respectively) of the battery, the leakage current is occurring.

In summary, when a leakage current, such as $I_{LEAK}$, is generated away from the midpoint of a battery stack, it may cause unequal currents, I1 and I2 to be generated. As a result, the value of Vout2 may be further below (more negative) the common mode voltage (chassis voltage) than the value of Vout1 is above the common mode voltage.

Further measurements can be performed and used to calculate a leakage impedance located in the mid-point of the battery stack 110 (i.e., a symmetrical leakage). This may be done by changing the circuit parameters.

For example, an alternative impedance 103a can be added in parallel (or series) with or even replace, for example, resistor 103 by having a switch 129 actuated to insert the resistor 103a. Of course, source resistor 102 may also have an impedance added in parallel (or series) with it, or be replaced with the impedance instead of source resistor 103. The voltages Vout1 and Vout2 may be measured with the new resistor 103a values, and may be used to calculate a leakage impedance and a leakage voltage. The calculation of the leakage impedance and the leakage voltage is described in more detail with reference to FIG. 3 below. In an alternative embodiment, the operation of detection circuit 120 would remain the same if a single-fixed reference voltage was substituted for the chassis potential on the non-inverting inputs of amplifiers 121, 131. This allows the amplifiers 121, 131 to operate from a single fixed power supply.

Figure 2:
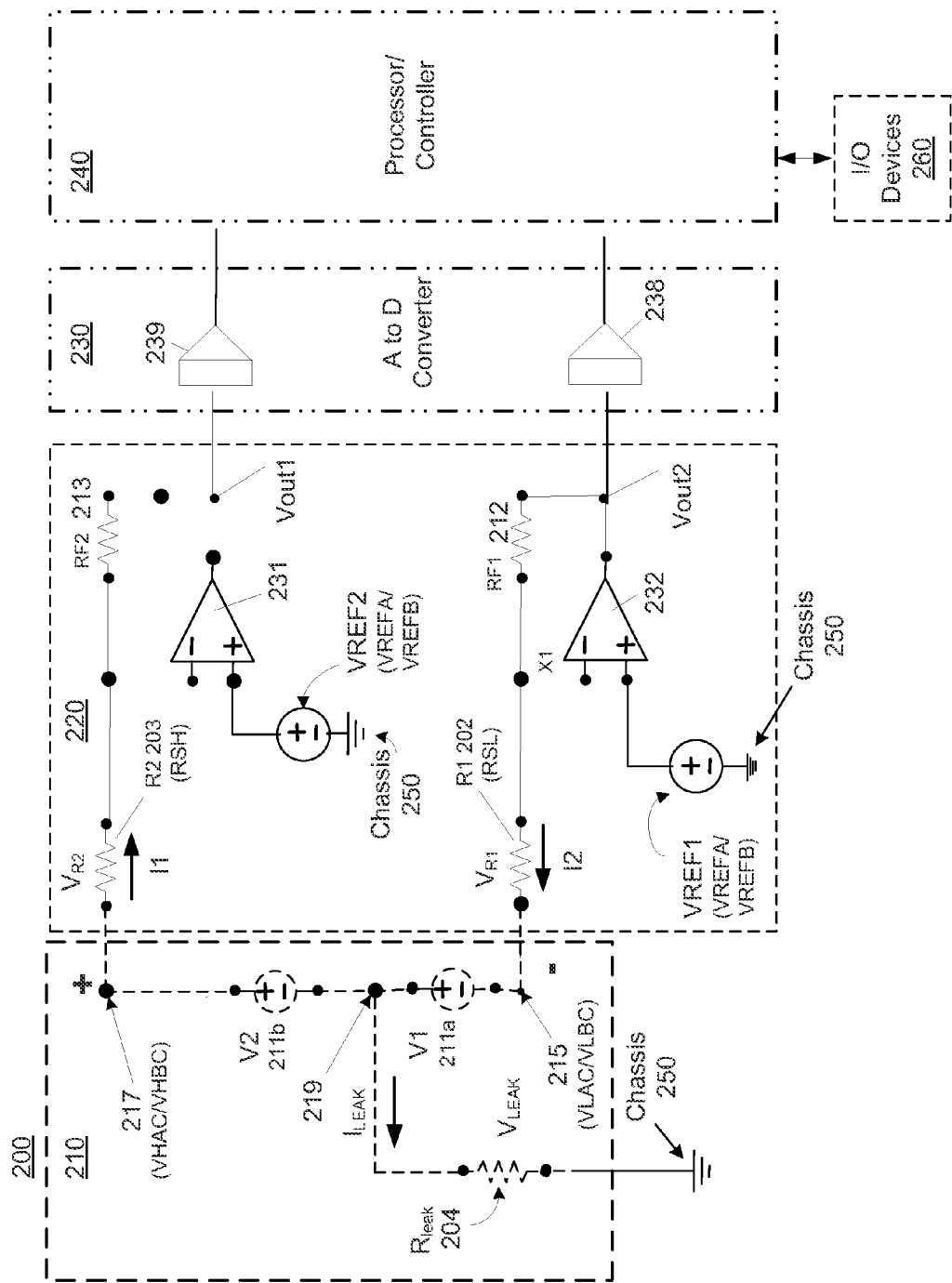
FIG. 2 illustrates another exemplary circuit according to another embodiment of the present invention.

FIG. 2 illustrates an exemplary implementation of a circuit that may have its circuit parameters changed by changing the values of respective values of VREF1 and VREF2. The exemplary system 200 comprises battery stack 210, detection circuit 220, analog-to-digital converter 230 and processor 240. The analog-to-digital converter 230 of system 200 may also be an internal or external processor 240. The battery stack 210 is arranged substantially as described above with respect to FIG. 1, and will not be described again.

The analog-to-digital converter (ADC) 230 may have inputs for reading the voltages Vout1 and Vout2. The two inputs may be connected to individual analog-to-digital converters 238 and 239, which may output the digital signals.

The processor/controller 240 may be used to calculate the value of Rleak 204 and the leakage voltage 219. The processor/controller 240 may include a processor and a memory for storing data measured by the processor such as voltage signals output by the ADC 230 or voltage signals output directly from the detection circuit 220. In addition, the memory may store pre-programmed data and instructions. The memory may also accessed for reading and writing functions via input/outputs 260. The processor/controller 240 may be a processor or controller, already available that performs other system processing and/or control, or processor 240 may forward the digital signals to another processor for processing. Optionally, the processor 240 may connect to input/output devices 260 to present battery stack 210 status, alarm conditions or other information, in an audible, tactile and/or a visual presentation, to an output device, such as a monitor or speaker. An alarm condition may be when the magnitude of the derived leakage impedance and/or derived leakage voltage exceeds a predetermined threshold or presents a hazard. An input device may be a touch screen, a button, a keypad, or the like.

The detection circuit 220 may connect to the positive (+) terminal 217 and the negative (−) terminal 215 of the battery stack 210. A first terminal of input resistor 202 connects to the negative (−) terminal 215 of the battery 210 and a second terminal to an inverting input of the amplifier 232. Resistor 202 may have a value of approximately 5-20 megaohms. Feedback resistor 212 may have a first terminal connecting to the inverting input of the amplifier 232, and a second terminal connected to the output of the amplifier 232. Feedback resistor 212 may have a value between 10s and 100s of kilohms.

In the exemplary embodiment, the amplifier 232 may have its inverting input connected to resistors 202 and 212, its non-inverting input connected to reference voltage source VREF1, and the output of the amplifier 232 may be connected to a second terminal of feedback resistor 212, and to an output of detector circuit 220. The output voltage Vout2 may be a voltage measured from the output of amplifier 232. Reference voltage sources VREF1 and VREF2 may remain above the potential at chassis ground when a single supply is provided to amplifiers 231 and 232.

Similarly, a first terminal of input resistor 203 may connect to the positive (+) terminal 217 of the battery 210 and a second terminal to an inverting input of the amplifier 231. Resistor 203 can have a value of approximately 5-20 megaohms. Feedback resistor 213 also may connect to the inverting input of the amplifier 231. Feedback resistor 213 can have a value of 10s to 100s of Kilohms.

The amplifier 231 can have its inverting input connected to resistors 203 and 213, its non-inverting input connected to voltage source VREF2, and the output of the amplifier 231 may be connected to a second terminal of feedback resistor 213 and to an output of detector circuit 220. Vout1 is a voltage measured from the output of amplifier 231.

Reference voltages VREF1 and VREF2 may be initially the same voltage, and set to a voltage greater than zero volts. Either or both of reference voltage sources VREF1 and VREF2 may be variable voltage sources controlled, for example, by a processor 240. The processor 240 can be internal or external to the system 200. The reference voltage sources VREF1 and VREF2 are applied to the non-inverting inputs of amplifiers 231 and 232, respectively.

Reference voltages VREF1 and/or VREF2 may be different or be equal. When needed, either both reference voltages VREF1 and VREF2 may be changed by the same amount of voltage or by different voltages, or only the voltage of one of VREF1 or VREF2 may be changed.

Analog-to-digital converter 230 can have inputs for reading the voltages Vout1 and Vout2 at the respective outputs of detection circuit 220. The two inputs can be connected to analog-to-digital converters 238 and 239, which may forward the digital signals to processor 240 for processing.

Leakage impedance Rleak 204 is illustrated as occurring at exemplary node 219 in the battery stack 210. Node 219 is also the location of the leakage voltage related to the failure condition. Node 219 can occur anywhere within the battery stack 210. Leakage impedance Rleak 204 and leakage voltage $V_{LEAK}$ at node 219 can have various values that may or may not change over time.

The operation of the circuit 220 and the calculation of the battery 210 voltage is substantially the same as described above with respect to FIG. 1. The output voltage Vout1 may be proportionally below the reference voltage VREF2, and output voltage Vout2 may be proportionally above the reference voltage VREF1. Assuming that VREF1=VREF2, the difference of Vout1 and Vout2 will be proportional to the full battery voltage from the battery stack 210.

Similar to the operation of the detection circuit 120 in FIG. 1, a change in the average voltage output above or below VREF1/VREF2, which, in this example, are assumed to be equal, from the battery stack 210 as detected by the amplifiers 231 and 232 may be used to indicate the presence of a leakage path represented by leakage impedance Rleak 204 having a leakage current $I_{LEAK}$ resulting in a leakage voltage ($V_{LEAK}$=Rleak*$I_{LEAK}$) at node 219.

Upon detection of a change of the average output from Vout1 and Vout2, one or both of reference voltage sources VREF1 and VREF2 can be changed to a new voltage value. The new voltage is above the chassis ground potential, when a single supply voltage is provided to the amplifiers 231 and 232. However, when the amplifiers 231 and 232 have both a positive power supply and a negative power supply, the new voltage value may go below the chassis ground potential.

The initial measurements of voltages Vout1 and Vout2 can be used to form a first equation that would have two unknowns: Leakage voltage Vleak 219 and Leakage resistance Rleak 204. Upon changing one or both of the reference voltages VREF1 and VREF2, a second equation is formed, also having the two unknown values, from measurements of Vout1 and Vout2 made using the new reference voltage(s).

The two equations are solved using the two equations and two unknowns, leakage impedance Rleak 204 and leakage voltage Vleak 219, according to common mathematical techniques. Solving the equations provides the battery stack 210 voltage, leakage voltage Vleak at node 219, and the leakage impedance Rleak 240 in the battery stack 210. Using this technique allows a leakage path located in a mid-point of the battery stack 110 (i.e., a symmetrical leakage) to be detected and calculated. This will be explained in more detail with respect to FIG. 3.

Figure 3:
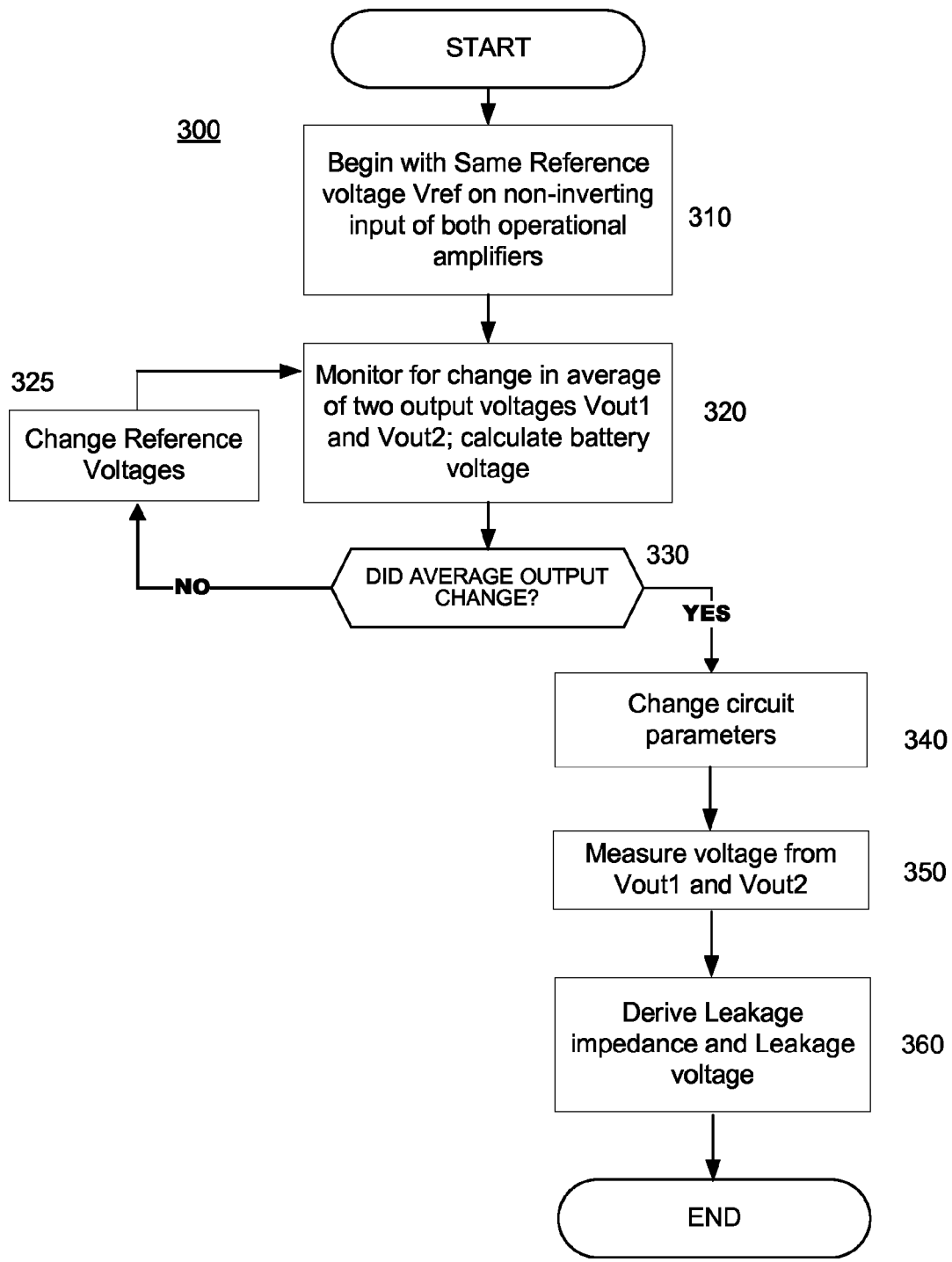
FIG. 3 illustrates an exemplary method according to an embodiment of the present invention.

In the exemplary method described with respect to FIG. 3, the detection circuit 220 can be in a first configuration in which, for example, the reference voltages VREF1 and VREF2 can be set to the same voltage, or resistor values are a first set of values. (Step 310). Alternatively, when the detection circuit 220 is in the first configuration the reference voltages VREF1 and VREF2 may be different voltages.

At step 320, an average of the two output voltages Vout1 and Vout2 are monitored for changes. The battery voltage and the average of the two output voltages may be continuously monitored by calculating the battery voltage using Vout1 and Vout2 (i.e., Vout1−(−)Vout2) and comparing the average to an expected average value. The expected average value may be a previously monitored average value or a preset average value that was stored in a memory accessible to the processor or controller. For example, if VREF1 is equal to VREF2, the expected average value may be equal to either VREF1 or VREF2. In another example, where VREF1 may not equal to VREF2, then the average voltage may be equal to the sum of (VREF1+VREF2) divided by 2. In these examples, it may be assumed that input resistors 202 and 203 are substantially equal, and the feedback resistors 212 and 213 are substantially equal. Of course, all measurements and comparisons may include tolerances to avoid false alarms and to compensate for tolerances within electrical components and the like.

At decision 330, a controller determines whether the average voltage has changed or not. If the average voltage has not changed, which may be due to either no leakage path being present, or a symmetrical leakage path being present, the decision is no, and the process proceeds to step 325. A symmetrical leakage path is a leakage path that originates at approximately a mid-point of a battery stack where no current flows through leakage impedance Rleak 204 in FIG. 2, for example.

At step 325, a circuit parameter may be changed. In an exemplary embodiment, a reference voltage value, such as VREF1 or VREF2, may be changed. The reference voltage value may be changed by a processor/controller, such as processor/controller 140, 240. For example, the processor/controller may continuously generate, for example, a sine wave voltage signal or a ramp wave voltage signal to be used as either VREF1 or VREF2. Alternatively, the processor/controller may cycle through predetermined different voltage values, that may be used as either VREF1 or VREF2. Alternatively, other circuit parameters may be changed, such as an impedance. After the change in circuit parameters, at step 325, the process returns to step 320 to monitor the average battery voltage and calculate the full battery voltage using Vout1 and Vout2. In an alternative embodiment, step 235 may only be executed after a predetermined time period passes, or after a predetermined number of iterations of steps 320 and 330. Based on the changed circuit parameters, a revised measurement of the first voltage can be obtained and compared for deviations from the predetermined voltage, or prior voltage measurements (e.g., average voltages).

If the controller determines at decision 330 that the average voltage has changed from a previous measurement, or a preset average voltage, such as due to the presence of a leakage path, the circuit parameters (such as reference voltages VREF1 and/or VREF2, source resistors R1 and/or R2) may be changed to place the detection circuit in a second configuration. In the exemplary embodiment, either one or both of the reference voltages VREF1 or VREF2 (step 340) are changed to place the detection circuit in a second configuration. The voltages VOUT1 and VOUT2 are measured (Step 350).

Using the previous measurements that are stored in memory associated with the processor/controller, for example, and the new measurements of voltages Vout1 and Vout2, the leakage impedance Rleak and leakage voltage VLEAK can be derived. (step 360).

Alternatively, instead of changing the voltages of either or both reference voltages, VREF1 and VREF2, an input resistor value R1 and/or an input resistor value R2 can be switched using transistors to switch in replacement resistance or add an additional resistor to provide a second detection circuit configuration for another, or second, measurement of Vout1 and Vout2. The second measurement can be used with the first measurement to derive the leakage voltage Vleak and leakage impedance Rleak using the exemplary equations below.

The method described with respect to FIG. 3 may be programmed and stored as computer instructions in firmware, a state machine, a memory device, or other machine-readable storage medium for execution by the above-described processor, or other device.

Several embodiments of the present invention are specifically illustrated and described herein. However, it will be appreciated that modifications and variations of the present invention are covered by the above teachings and within the purview of the appended claims without departing from the spirit and intended scope of the invention.

Exemplary Equations for Deriving Leakage Impedance and Leakage Voltage:

RSL=input resistor 202; RSH=input resistor 203; RLEAK represented as 204

V1=the voltage of 211a

VLAC=bottom of V1 (shown as terminal 215) for first measurement

VLBC=bottom of V1 (shown as terminal 215) for second measurement

VHAC=top of V2 (shown as terminal 217) for first measurement

VHBC=top of V2 (shown as terminal 217) for second measurement

VREFA=Initial reference voltage (FIG. 3, step 320) =VREF1=VREF2

VREFB=second reference voltage in which both VREF1 and VREF2 may change from VREFA, where VREF1=VREF2 (FIG. 3, step 350).

The equations below assume that both reference voltages VREF1 and VREF2 are equal.

Equation 1, where VREF1 equals VREF2, which equal VREFA:

$$\frac{(VHAC - VREFA)}{RSH} + \frac{(VLAC - VREFA)}{RSL} + \frac{(VLAC + V1)}{RLEAK} = 0$$

Equation 2, where VREF1 equals VREF2, which equal VREFB:

$$\frac{(VHBC - VREFB)}{RSH} + \frac{(VLBC - VREFB)}{RSL} + \frac{(VLBC + V1)}{RLEAK} = 0$$

Then (Equation 3) RLEAK equals:

$$\frac{-(VLBC - VLAC) \times RSH}{\left(\begin{array}{c}(RSL \times (VHBC - VREFB - VHAC + VREFA)) + \\ (RSH \times (VLBC - VREFB - VLAC + VREFA))\end{array}\right)}$$

Then (Equation 4) V1 equals:

$$\frac{-[(RSL \times RLEAK) \times (VHAC - VREFA)] + [(RSH \times RLEAK) \times (VLAC - VREFA)] + [(RSH \times RSL) \times VLAC]}{RSH \times RSL}$$

1. VLAC, VLBC, VHAC, and VHBC may be determined from Vout1 and Vout2 using standard equations for inverting amplifier configurations.
2. Battery stack voltage (V1+V2)=VHAC−VLAC or it can equal VHBC−VLBC.
3. The above equations illustrate but one method of deriving Rleak and Vleak. Other equations may be implemented to derive Rleak and Vleak.

I claim:

1. A method for identifying a presence of a leakage path in a multi-cell voltage source, comprising:
   measuring the voltage of the voltage source using a first circuit path configuration to obtain a first voltage measurement, wherein the first circuit path configuration comprises a pair of amplifiers connecting in inverting configurations;
   when the first voltage measurement shows a deviation from a predetermined voltage,
      configuring the circuit path to a second configuration;
      measuring the voltage of the voltage source using the second circuit path configuration to obtain a second voltage measurement; and
   deriving a leakage impedance and a leakage voltage from the first and second voltage measurements; and
   if a deviation is not detected, repeating another iteration of measuring the voltage of the voltage source to obtain a new first voltage measurement; and
   after a predetermined number of iterations in which a deviation is not detected, configuring the circuit path to another circuit path configuration to obtain a revised measurement of the voltage source; and
   using the revised measurement of the voltage source to determine if the revised measurement deviates from the predetermined voltage.

2. The method of claim 1, wherein the configuring comprises: adding an impedance in the first circuit path configuration to form the second circuit path configuration.

3. The method of claim 1, wherein the configuring comprises:
   changing a reference voltage used in the first circuit path configuration to a different reference voltage to form the second circuit path configuration.

4. The method of claim 1, wherein configuring the circuit path to another circuit path configuration comprises using a different reference voltage value from one of the reference voltages used in the first circuit path configuration.

5. The method of claim 1, wherein configuring the circuit path to another circuit path configuration comprises adding an impedance in the first circuit path configuration.

6. The method of claim 5, wherein the impedance is added in parallel with an input resistor of the detection circuit.

7. A system for determining a leakage impedance of a voltage source, comprising:
   a voltage source formed from multiple voltage cells;
   a detection circuit having a first circuit path configuration to obtain a first measurement of the voltage source and a second circuit path configuration to obtain a second measurement of the voltage source that is implemented when the first measurement of the voltage source shows a deviation from a predetermined voltage; and
   a processor for identifying a leakage impedance of the voltage source using the first voltage measurement and the second voltage measurement,
   wherein the detection circuit further comprises a first amplifier and a second amplifier, a first input of the first amplifier connected to a first terminal of the voltage source and the first input of the second amplifier connected to a second terminal of the voltage source, a second input of each of the first and second amplifiers connected to a reference voltage point, and an output of each of the first and second amplifiers connected to a respective first and second output of the detection circuit,
   wherein the first reference voltage source and the second reference voltage source supply respective first voltages to the first amplifier and the second amplifier, respectively, when the detection circuit is in a first configuration; and
   the first reference voltage source and the second reference voltage source supply respective second voltages to the first amplifier and the second amplifier, respectively, when the detection circuit is in a second configuration, wherein the voltage supplied by the first reference voltage source is different from the voltage supplied by the second reference voltage.

8. The system of claim 7, further comprising:
   an analog-to-digital converter having inputs connected to the first and second outputs of the detection circuit for receiving analog signals output from the detection circuit, and having outputs connected to the processor for providing a digital signal converted from the received analog signals.

9. The system of claim 7, wherein the detection circuit further comprises:
   switchable input resistors connected between the first terminal of the voltage source and the first terminal of the first amplifier, or connected between the second terminal of the voltage source and the first terminal of the second amplifier.

10. The system of claim 7, wherein the detection circuit further comprises:

a single reference voltage source connected to the second input of each of the first and second amplifiers.

11. The system of claim 7, wherein the detection circuit further comprises:
a first reference voltage source connected to the second input of the first amplifier and a second reference voltage source connected to the second input of the second amplifier.

12. A circuit for detecting a leakage impedance and leakage voltage of a multi-cell voltage source, comprising:
a first amplifier having a first input connected to a first terminal of the voltage source, a second input connected to a first reference voltage source, and an output connected to an output of the circuit, wherein the first reference voltage has a first reference voltage value;
a second amplifier having a first input connected to a second terminal of the voltage source, a second input connected to a second reference voltage source, and an output connected to another output of the circuit, wherein the second reference voltage has a second reference voltage value;
a first input resistor connected between the first terminal of the voltage source and the first input of the first amplifier;
a second input resistor connected between the second terminal of the voltage source and the first input of the second amplifier;
a first feedback resistor connected between the output of the first amplifier and the first input of the first amplifier; and
a second feedback resistor connected between the output of the second amplifier and the first input of the second amplifier.

13. The circuit of claim 12, further comprising:
a chassis ground potential is the reference voltage value of the first reference voltage value and the second reference voltage value.

14. The circuit of claim 12, wherein the first reference voltage and the second reference voltage are the same voltage value based on the chassis ground potential.

15. The circuit of claim 12, wherein the first reference voltage source and the second reference voltage source output different voltages.

16. The circuit of claim 12, further comprising an alternative input resistor inserted in parallel the first input resistor.

* * * * *